(12) United States Patent
Blalock et al.

(10) Patent No.: US 8,106,438 B2
(45) Date of Patent: Jan. 31, 2012

(54) STUD CAPACITOR DEVICE AND FABRICATION METHOD

(75) Inventors: Guy Blalock, Eagle, ID (US); Scott Meikle, Gainesville, VA (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 11/209,011

(22) Filed: Aug. 22, 2005

(65) Prior Publication Data

US 2007/0040205 A1 Feb. 22, 2007

(51) Int. Cl.
*H01L 29/94* (2006.01)

(52) U.S. Cl. ........ 257/306; 257/296; 257/300; 257/301; 257/304; 257/305; 257/309; 257/310; 257/311; 257/532; 257/535; 257/E27.016; 257/E27.033; 257/E27.034; 257/E27.048; 257/E27.071; 257/E29.218

(58) Field of Classification Search .......... 257/301, 257/304, 305, 306, 532, E27.034, E27.048, 257/301.1, 303, 296, 300, 309, 310, 311, 257/535, E27.016, E27.033, E27.071, E29.218; 361/301.1, 303
See application file for complete search history.

(56) References Cited

U.S. PATENT DOCUMENTS

| | | | | |
|---|---|---|---|---|
| 5,581,436 A | * | 12/1996 | Summerfelt et al. | 361/321.1 |
| 6,168,991 B1 | | 1/2001 | Choi et al. | |
| 6,281,537 B1 | * | 8/2001 | Kim | 257/295 |
| 6,423,999 B1 | * | 7/2002 | Matsuki | 257/306 |
| 6,524,912 B1 | * | 2/2003 | Yang et al. | 438/258 |
| 6,566,701 B2 | * | 5/2003 | Agarwal | 257/306 |
| 6,599,794 B2 | * | 7/2003 | Kiyotoshi et al. | 438/240 |
| 6,617,634 B2 | * | 9/2003 | Marsh et al. | 257/300 |
| 6,876,028 B1 | * | 4/2005 | Coolbaugh et al. | 257/306 |
| 6,963,097 B2 | * | 11/2005 | Kweon | 257/295 |
| 7,105,885 B2 | * | 9/2006 | Hong | 257/306 |
| 2001/0044179 A1 | | 11/2001 | Kim | |
| 2002/0009891 A1 | | 1/2002 | Ting et al. | |
| 2004/0178505 A1 | | 9/2004 | Park et al. | |

* cited by examiner

*Primary Examiner* — Jay C Kim

(74) *Attorney, Agent, or Firm* — Knobbe, Martens, Olson & Bear, LLP

(57) ABSTRACT

The present teachings relate to a method of forming a container capacitor structure on a substrate. In one embodiment, the method comprises etching a recess in the substrate, depositing a first conductive layer on the substrate so as to overlie the substrate and the recess, depositing a filler layer so as to overlie the first conductive layer and fill the recess, and etching the first and second conductive layers so as to define a lower electrode within the recess. The method further comprises forming a cap layer on the lower electrode so as to overlie the first conductive layer and the filler layer and etching at least a portion of the substrate away from the lower electrode to thereby at least partially isolate the lower electrode. Subsequently, the remainder of the capacitor structure may be formed by depositing a dielectric layer on the lower electrode and depositing a second conductive layer on the dielectric layer so as to form an upper electrode.

7 Claims, 10 Drawing Sheets

STUD CAPACITOR DEVICE AND FABRICATION METHOD

BACKGROUND OF THE INVENTION

1. Field of the Invention

The present invention relates to electronic devices, and, in particular, relates to devices and methods of forming capacitor structures for integrated circuitry.

2. Description of the Related Art

Since the introduction of the digital computer, electronic storage devices have been a vital resource for the retention of binary data. Conventional semiconductor electronic storage devices typically incorporate capacitor and transistor type structures, which are referred to as Dynamic Random Access Memory (DRAM), that temporarily store binary data based on the charged state of the capacitor structure. In general, this type of semiconductor Random Access Memory (RAM) often requires densely packed capacitor structures that are easily accessible for electrical interconnection therewith. Many of these capacitor structures are fabricated with layers of material including semiconductor, dielectric, and metal.

Conventional fabrication techniques of capacitor structures include processing steps that require etching of a recess in a substrate so as to form a cell container, contiguous deposition of a lower conductive layer on the substrate and within the recess, and etching of the lower conductive layer so as to form a stud electrode within the recess. Additional processing steps include removal of the surrounding substrate material laterally adjacent to the stud electrode. Then, to form the rest of the capacitor structure, a dielectric layer followed by a top conductive layer can be deposited on the stud electrode. Unfortunately, during deposition of the lower conductive layer, excessive overfill of the recessed cell container is a common occurrence due to the need for complete surface coverage. The excessive overfill material is removed and discarded, which is wasteful and inefficient. In addition, fabrication efficiency can be reduced if expensive conductive materials, such as noble metals including Platinum, are excessively deposited and subsequently removed during etching. This can result in increased manufacturing costs, which is also undesirable.

Hence, there currently exists a need to reduce manufacturing costs associated with fabricating capacitor structures by simplifying inefficient procedures. To this end, there also exists a need to increase fabrication efficiency by improving the processing techniques associated with fabricating capacitor structures.

SUMMARY OF THE INVENTION

The aforementioned needs may be satisfied by a method of forming a capacitor structure on a substrate. In one embodiment, the method may comprise forming a recess in the substrate, depositing a first conductive layer on the substrate so as to overlie the substrate and the recess, and depositing a filler layer so as to overlie the first conductive layer and fill the recess. In addition, the method may further comprise removing at least a portion of the first and second conductive layers so as to define a lower electrode within the recess, forming a cap layer on the lower electrode so as to overlie the first conductive layer and the filler layer, and removing at least a portion of the substrate away from the lower electrode to thereby at least partially isolate the lower electrode. Moreover, the method may still further comprise depositing a dielectric layer on the lower electrode and depositing a second conductive layer on the dielectric layer so as to form an upper electrode. In one embodiment, a conductive layer is formed on an outer surface of the upper electrode. The conductive layer is preferably selected from the group consisting of Platinum, Iridium, and Osmium.

In one aspect, the method may still further comprise recessing at least a portion of the lower electrode below the substrate to thereby form the cap layer therein so as to overlie the lower electrode. In addition, forming the cap layer may include depositing a conductive material on the substrate so as to overlie the lower electrode and removing at least a portion of the cap layer so as to define an electrode cap on the lower electrode. Also, forming a recess in the substrate may include forming a cell mold pattern that defines the shape of the lower electrode, and removing at least a portion of the substrate away from the lower electrode includes removing the substrate material proximate to the lower electrode. Furthermore, the lower electrode and cap layer may comprise Platinum, Iridium, Osmium or various other types of metals, and the filler layer may comprise Nickel, Cobalt, or various other types of similar materials. In one embodiment, a conductive layer is formed on an outer surface of the cap layer. The conductive layer is preferably selected from the group consisting of Platinum, Iridium, and Osmium.

The aforementioned needs may also be satisfied by a method of forming a plurality of capacitor structures on a substrate. In one embodiment, the method may comprise forming a plurality of recesses in the substrate, conformally depositing a first conductive layer on the substrate so as to overlie the substrate and the recesses, and conformally depositing a filler layer so as to overlie the first conductive layer and fill the recesses. In addition, the method may further comprise removing at least a portion of the first and second conductive layers so as to define a plurality of lower electrodes within the recesses, conformally depositing a cap layer on the substrate so as to overlie the lower electrodes, and removing at least a portion of the cap layer so as to define an electrode cap on each of the lower electrodes. Moreover, the method may still further comprise removing at least a portion of the substrate away from the lower electrodes to thereby at least partially isolate the lower electrodes, conformally depositing a dielectric layer on the lower electrodes, and conformally depositing a second conductive layer on the dielectric layer so as to form a common upper electrode. In one aspect, forming a plurality of recesses may include forming an array of recesses, wherein forming a plurality of recesses in the substrate may include spacing the recesses a first distance apart. In addition, removing at least a portion of the substrate away from the lower electrodes may include removing at least a portion of the substrate between the lower electrodes, wherein etching at least a portion of the substrate away from the lower electrodes may include removing at least a portion of the substrate proximate to the lower electrodes.

The aforementioned needs may also be satisfied by a capacitor device formed on a substrate. In one embodiment, the device may comprise a lower electrode having side and base walls that are joined together so as to define and interior recess in the shape of a container, the lower electrode having an interior plug formed therein and an electrode cap formed thereabove so as to at least partially enclose the interior plug, wherein the interior plug comprises a different material than the side and base walls. In one embodiment, a conductive layer is formed on an outer surface of the interior plug. The conductive layer is preferably selected from the group consisting of Platinum, Iridium, and Osmium. In addition, the device may further comprise a dielectric layer formed on the lower electrode and an upper electrode formed on the dielectric layer. These and other objects and advantages of the present invention will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout. An improved method for forming one or more capacitor structures including an array of capacitor structures will be described in greater detail herein below with reference to the drawings.

Figure 1A:
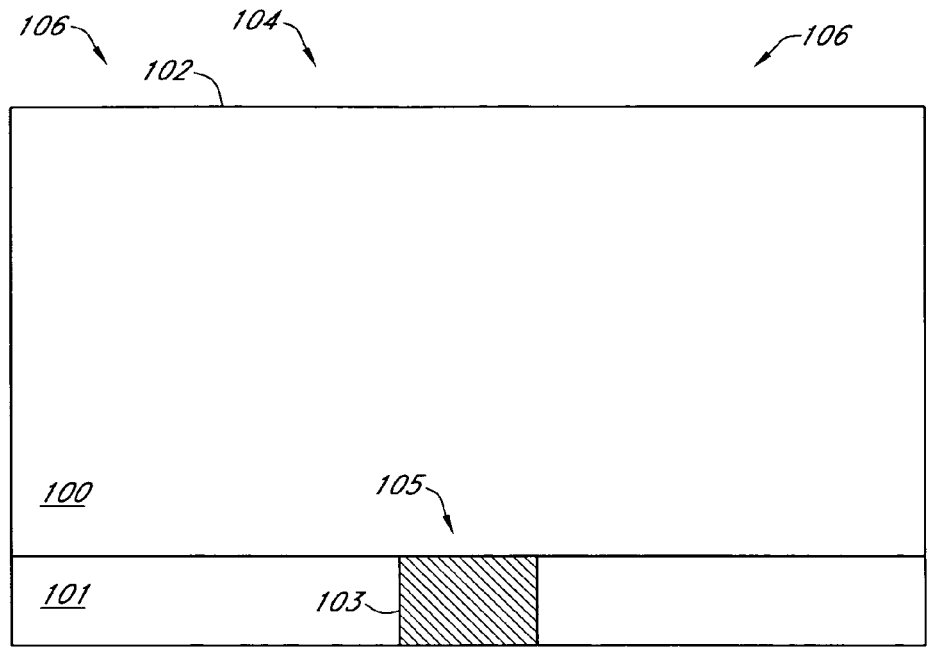
FIGS. 1A-1L illustrate one embodiment of a method for forming a capacitor structure.

FIGS. 1A-1K illustrate one embodiment of a method for forming at least one capacitor structure. In particular, FIG. 1A illustrates one embodiment of a first interlayer dielectric (ILD) layer 100 deposited on a second ILD layer 101. As illustrated, the first ILD layer 100 comprises an upper surface 102 and an interior field region 104 surrounded by a periphery field region 106. In one embodiment, the ILD layers 100, 101 may comprise an insulative material, such as borophosphosilicate glass (BPSG) or a generally known field oxide material. In addition, the second ILD layer 101 may comprise a generally known conductive plug, trace, or contact 103 that abuts the first ILD layer 100. It should be appreciated that the plug, trace, or contact 103 defines a capacitor node region 105 and may comprise a generally known electrical interconnect between the first ILD layer 100 and a circuit component (not shown), such as a transistor or various other types of circuit components. Moreover, It should also be appreciated that the periphery field region 106 may include any region on the first ILD layer 100.

In one aspect, either of the illustrated ILD layers 100, 101 may be referred to as a "substrate" and may also comprise at least a portion of a conventional silicon wafer, but can more generally encompass structures comprising semiconductive material or variations thereof, including, but not limited to, bulk semiconductor materials such as a semiconductor wafer (either alone or in assemblies comprising other materials thereon), and semiconductive material layers (either alone or in assemblies comprising other materials). Moreover, the term "ILD" or "substrate" may also encompass any supporting or layered structures, including, but not limited to, oxide or semiconductive structures, layers, or substrates. Furthermore, when reference is made to the ILD layers 100, 101 within the following description, previous processing steps may have been utilized to form regions, structures, or junctions in or on its base oxide or semiconductor structure or foundation.

Figure 1B:
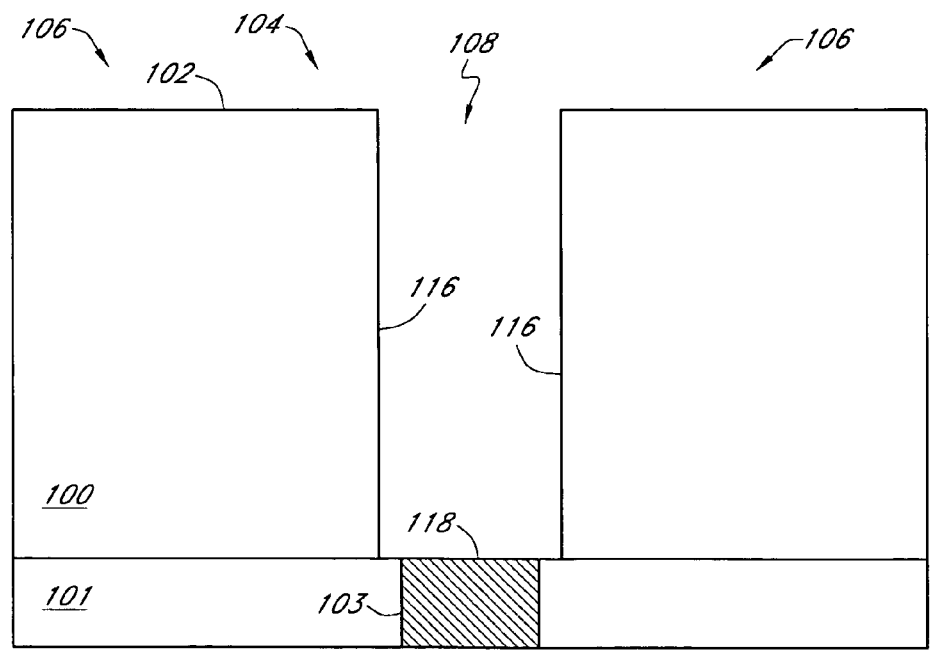

FIG. 1B illustrates the formation of a recess or cell container 108 in the interior field region 104 of the first ILD layer 100. In one embodiment, as illustrated in FIG. 1B, the recess or cell container 108 comprises interior surfaces or walls 116 and a base wall or surface 118 that define the shape or contour thereof. In addition, it should be appreciated that the cell container 108 may also be referred to as a cell mold pattern, wherein the cell container or cell mold pattern 108 may be formed in the interior or periphery filed region 104, 106 of the first ILD layer 100 without departing from the scope of the present invention.

In one embodiment, formation of the cell container 108 may comprise a generally known photo-mask pattern and etch technique that is adapted to etch the first ILD layer 100 below the upper surface 102 to a depth, for example, of approximately 2 microns or 20,000 Angstroms so as to define the shape or contour of cell container 108. Also, as illustrated, the cell container 108 may be etched to the plug 103 of the second ILD layer 101. It should be appreciated that the depth of the cell container 108 may vary in magnitude depending on the particular application without departing from the scope of the present invention. Additionally, in one embodiment, as illustrated in FIG. 1B, the contour of the cell container 108 may resemble a substantially rectangular shape. It should be appreciated that the contour of the cell container 108 may comprise various other shapes, such as circular, elliptical, cylindrical, triangular, etc., without departing from the scope of the present invention.

Figure 1C:
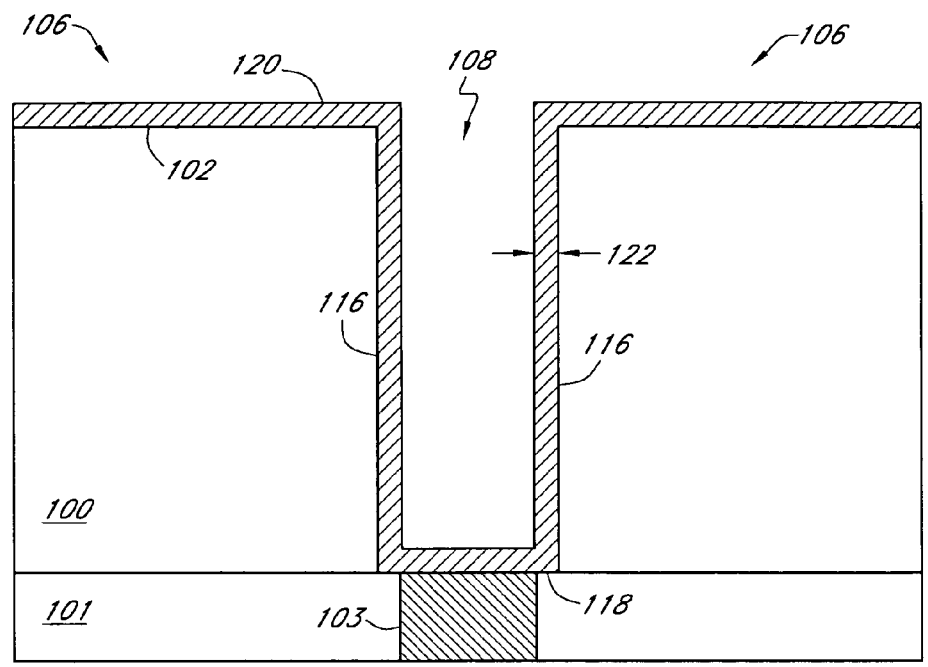

FIG. 1C illustrates the conformal deposition of a first conductive layer 120 on the upper surface 102 of the first ILD layer 100 and within the cell container 108. In one embodiment, the first conductive layer 120 may be deposited using, for example, a generally known furnace deposition process, such as chemical vapor deposition (CVD), plasma enhanced CVD (PECVD), or the like. In addition, the first conductive layer 120 may comprise a layer of conductive material, such as platinum (Pt), having a thickness 122, for example, of approximately 100 Angstroms. It should be appreciated that, depending on the particular application, the deposition of conformal Pt or various other electrode films may be achieved to a desired thickness for substantial surface coverage. In one aspect, as illustrated in FIG. 1C, the first conductive layer 120 may be deposited within the cell container 108 so as to overlie the width, shape, and/or contour thereof including the interior and base surfaces or walls 116, 118 of the cell container 108. Moreover, the first conductive layer 120 may be deposited adjacent the plug 103 so as to be in electrical contact therewith.

It should be appreciated that the first conductive layer 120 may be deposited using any one of a number of generally known deposition techniques without departing from the scope of the present invention. In addition, it should be appreciated that the first conductive layer 120 may comprise various other conductive materials, such as doped polysilicon, TiN, WSi, and metal or metal alloys including at least a portion of copper, aluminum, silver, gold, rhodium, iridium, etc., without departing from the scope of the present invention. Moreover, it should also be appreciated that the thickness 122 of the first conductive layer 120 may vary in magnitude, for example, of at least greater than 30 Angstroms or between approximately 30 Angstroms and 500 Angstroms, depending on the particular implementation without departing from the scope of the present invention.

Figure 1D:
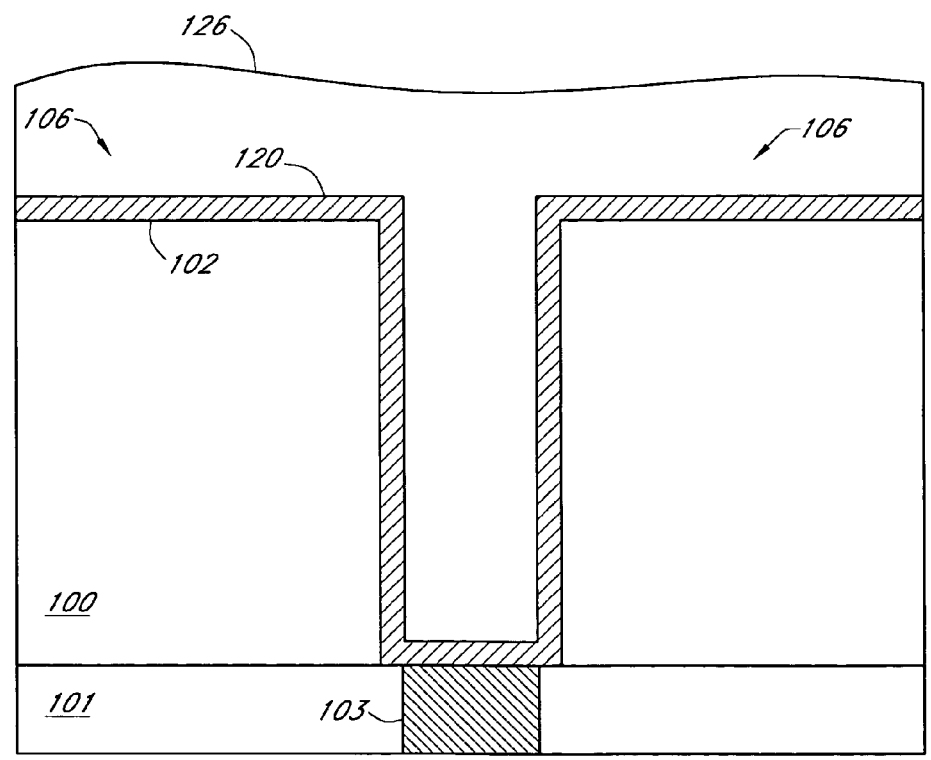

FIG. 1D illustrates the blanket deposition of a conformal filler layer 126 on the first conductive layer 120 and within the cell container 108. In one embodiment, the filler layer 126 may be deposited using, for example, a generally known furnace deposition process, such as chemical vapor deposition (CVD), plasma enhanced CVD (PECVD), or the like. In addition, the filler layer 126 may comprise a thick layer of conductive material, such as Nickel (Ni) or Cobalt (Co). It should be appreciated that the blanket deposition of conformal Ni, Co, or various other similar films may be achieved to a desired thickness for substantial surface coverage. In one aspect, the filler layer 126 may be deposited within the cell container 108 so as to substantially fill the interior and width of the cell container 108. Moreover, the filler layer 126 may be deposited adjacent the first conductive layer 120 so as to be in electrical contact therewith.

It should be appreciated that the filler layer 126 may be deposited using any one of a number of generally known deposition techniques without departing from the scope of the present invention. In addition, it should be appreciated that the filler layer 126 may comprise various other conductive materials, such as doped polysilicon, TiN, WSi, and metal or metal alloys including at least a portion of copper, aluminum, silver, gold, platinum, rhodium, iridium, etc., without departing from the scope of the present invention.

Figure 1E:
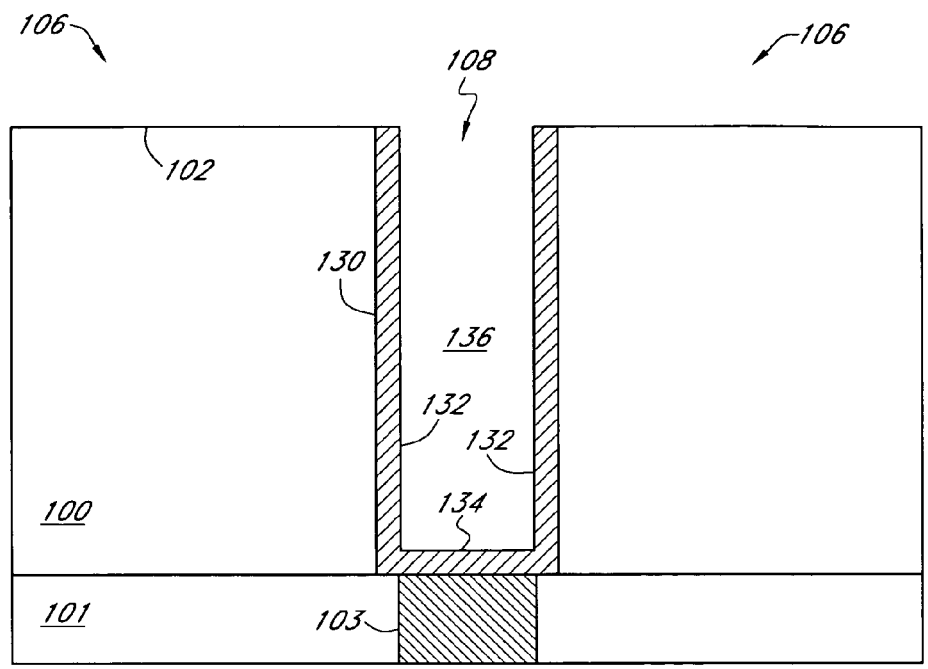

FIG. 1E illustrates the planarization of the first conductive layer 120 and the filler layer 126 adjacent the upper surface 102 of the first ILD layer 100. In one embodiment, the layers 120, 126 are planarized so as to define a lower electrode or lower cell plate 130 within the cell container 108 having an interior plug 136. The interior plug 136 comprises at least a portion of the filler layer 126 of FIG. 1D that was deposited in the cell container 108. In addition, a generally known chemical mechanical planarization (CMP) process may be used to remove and planarize the layers 120, 126, as illustrated in FIG. 1E, adjacent the upper surface 102 in a manner so as to form the lower electrode 130 as illustrated in FIG. 1E. As further illustrated in FIG. 1E, the width of the lower electrode 130 comprises the width of the cell container 108. Also, the lower electrode 130 may comprise sidewalls 132 and a base wall 134 that are joined together so as to define the lower electrode 130, which may also be referred to as stud or post electrode. Moreover, the base wall 134 of the lower electrode 130 is in electrical contact with the plug 103.

Figure 1F:
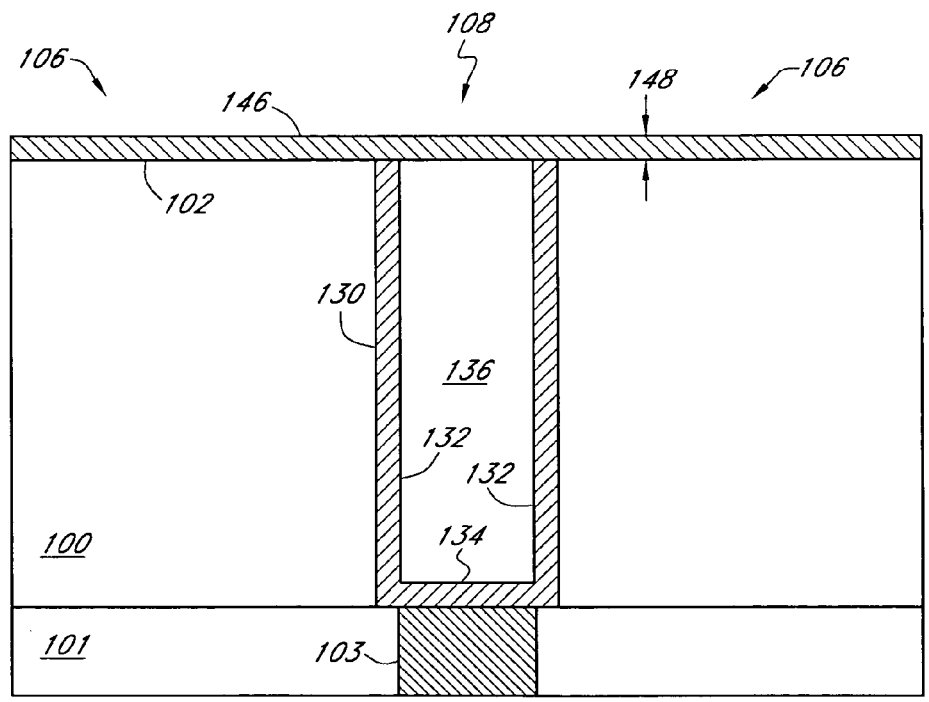

FIG. 1F illustrates the blanket deposition of a second conductive layer 146 on the upper surface 102 of the first ILD layer 100 and on the lower electrode 130 including the interior plug 136. In one embodiment, the second conductive layer 146 may be deposited using, for example, a generally known furnace deposition process, such as chemical vapor deposition (CVD), plasma enhanced CVD (PECVD), or the like. The second conductive layer 146 may also be deposited using a selective electroless plating technique. In addition, the second conductive layer 146 may comprise a layer of conductive material, such as platinum (Pt), Iridium, or Osmium having a thickness 148, for example, of approximately 100 Angstroms.

It should be appreciated that, depending on the particular application, the blanket deposition of Pt or various other electrode films may be achieved to a desired thickness for substantial surface coverage. In one aspect, as further illustrated in FIG. 1F, the second conductive layer 146 may be deposited so as to overlie the width of the cell container 108. Moreover, the second conductive layer 146 may be deposited adjacent the lower electrode 130 including the interior plug 136 so as to be in electrical contact therewith.

Additionally, it should be appreciated that the second conductive layer 146 may be deposited using any one of a number of generally known deposition techniques without departing from the scope of the present invention. In addition, it should be appreciated that the second conductive layer 146 may comprise various other conductive materials, such as doped polysilicon, TiN, WSi, and metal or metal alloys including at least a portion of copper, aluminum, silver, gold, rhodium, iridium, etc., without departing from the scope of the present invention. Moreover, it should also be appreciated that the thickness 148 of the second conductive layer 146 may vary in magnitude, for example, of at least greater than 30 Angstroms or between approximately 30 Angstroms and 500 Angstroms, depending on the particular implementation without departing from the scope of the present invention.

Figure 1G:
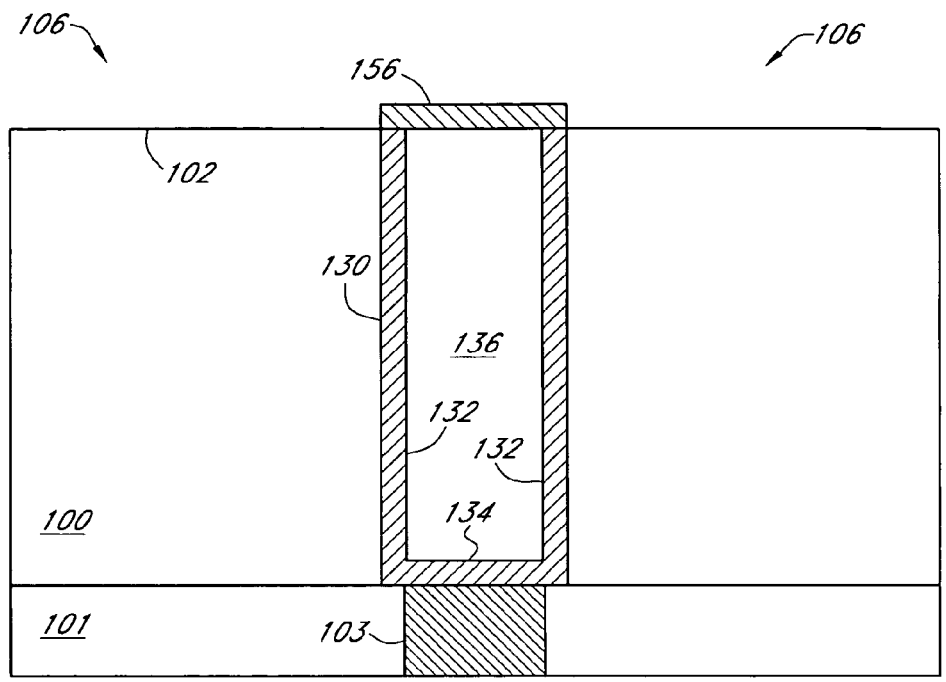

FIG. 1G illustrates the formation or etching of an electrode cap 156 from the second conductive layer 146 of FIG. 1F. As illustrated in FIG. 1G, formation of the electrode cap 156 may comprise a generally known photo-mask pattern and etch technique that is adapted to etch the second conductive layer 146 to a width approximate to the width of the lower electrode 130. For example, a photo-mask is patterned on the second conductive layer 146 so as to overlie the desired location of the electrode cap 156. Next, the exposed material of the second conductive layer 146 is etched using a generally known etching technique, such as a dry or wet etch, and the photo-mask is subsequently removed.

In one embodiment, the electrode cap 156 is formed so as to overlie the upper portion of the interior plug 136 and the sidewalls 132 of the lower electrode 130 and electrically couple therewith. Additionally, the electrode cap 156 substantially encapsulates the interior plug 136 within the interior portion of the lower electrode 130. Advantageously, the electrode cap 156 together with the sidewalls 130 of the lower electrode 130 provides an increased outer surface area for the subsequent deposition of a dielectric material layer and an upper electrode layer as will be described in greater detail herein below with reference to FIGS. 1I-1J. Moreover, the increased outer surface area of the lower electrode 130 can increase the overall capacitance of the resultant capacitor structure as will also be described in greater detail herein below with reference to the FIGS. 1K-1L.

Figure 2A:
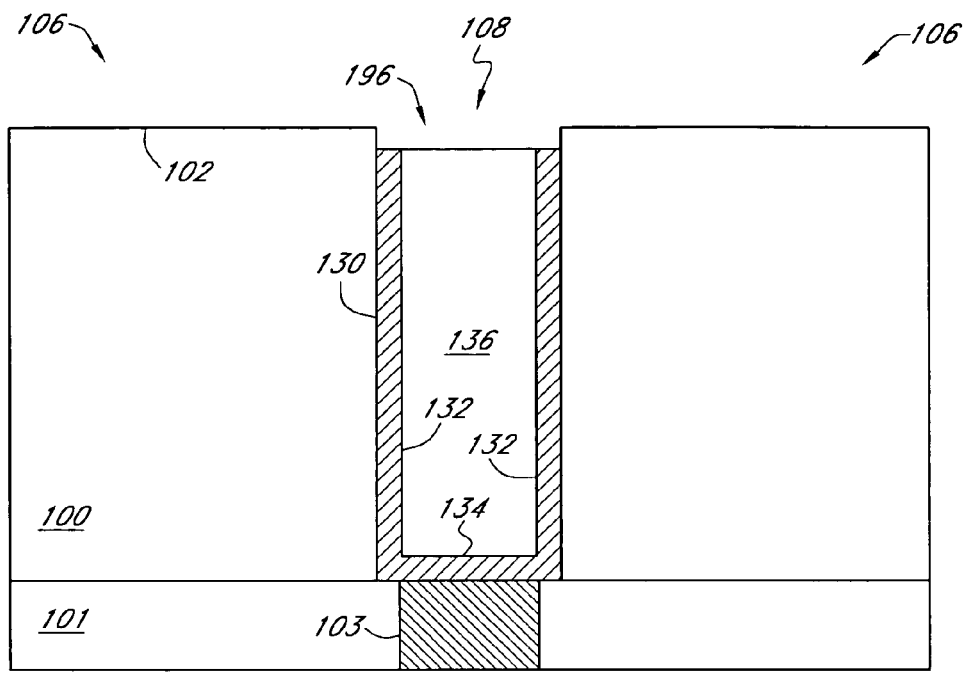
FIGS. 2A-2C illustrate an alternative method for forming an electrode cap.

Alternatively, as described with reference to FIGS. 2A-2C, the electrode cap 156 may be formed by recessing the interior plug 136 and the sidewalls 132 of the lower electrode 130 by an amount at least as much as the desired thickness of the electrode cap 156. In one embodiment, as illustrated in FIG. 2A, a recessed region 196 may be formed using a generally known pattern and etch technique. For example, a photo-mask is patterned on the upper surface 102 of the first ILD layer 100 so as to overlie the periphery field region 106 and so as to define an opening above the lower electrode 130. Next, the exposed material of the lower electrode 130 is etched using a generally known etching technique, such as a dry or wet etch, and the photo-mask is subsequently removed. It should be appreciated that the recessed region 196 as illustrated in FIG. 2A may be formed after the processing of the previously described FIG. 1E.

Figure 1H:
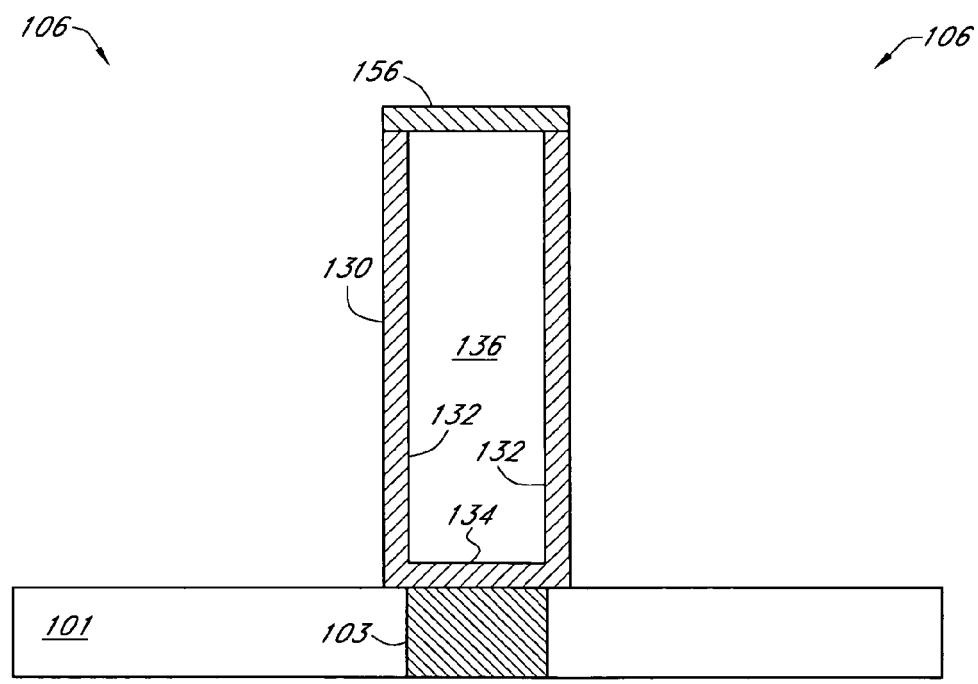
Figure 1I:
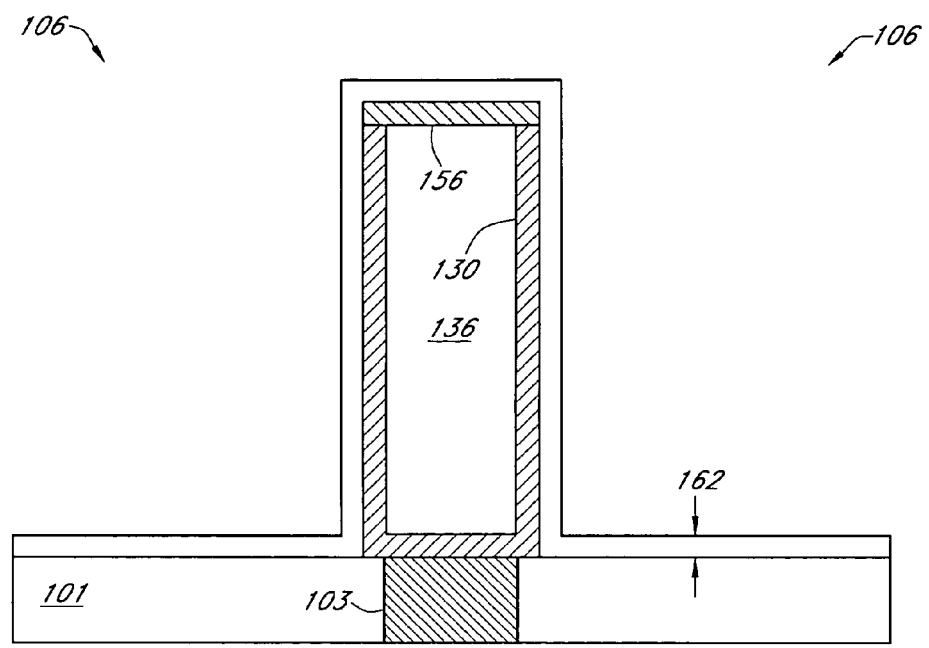
Figure 1J:
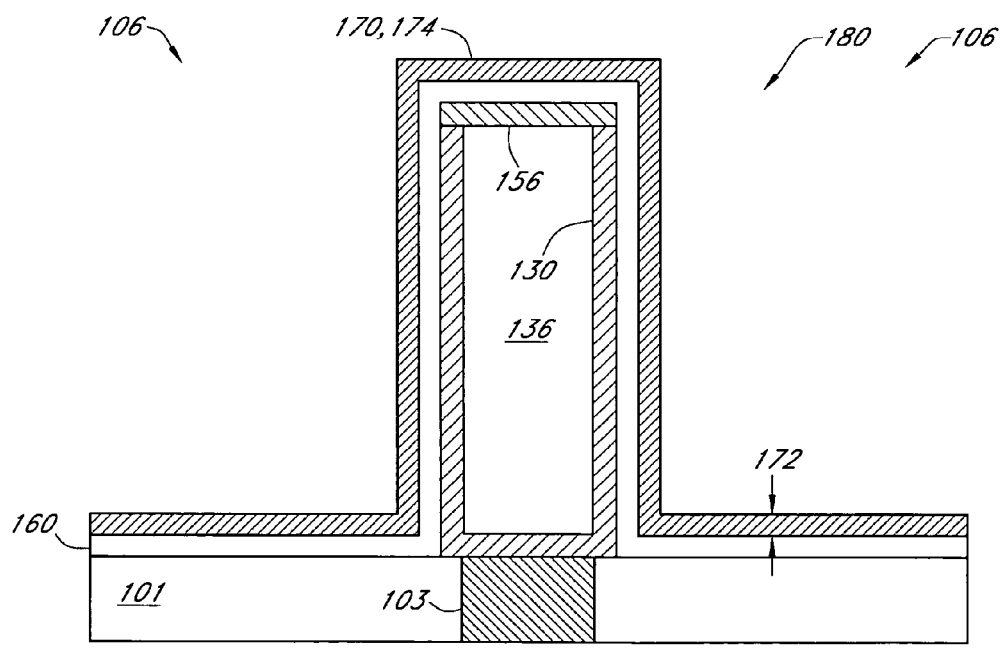
Figure 1K:
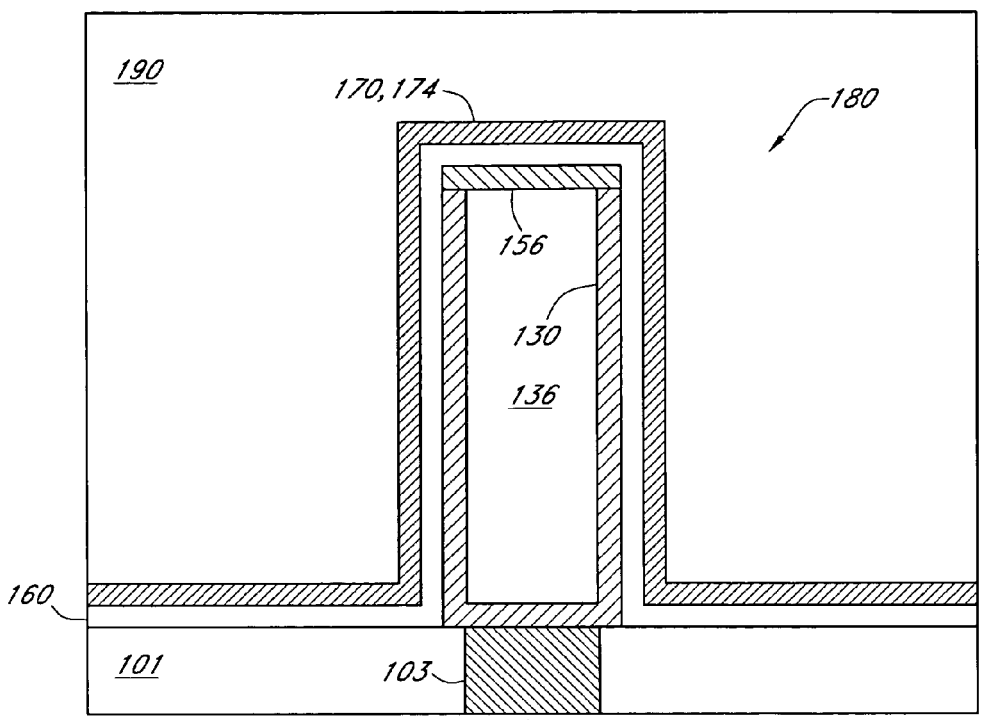
Figure 1L:
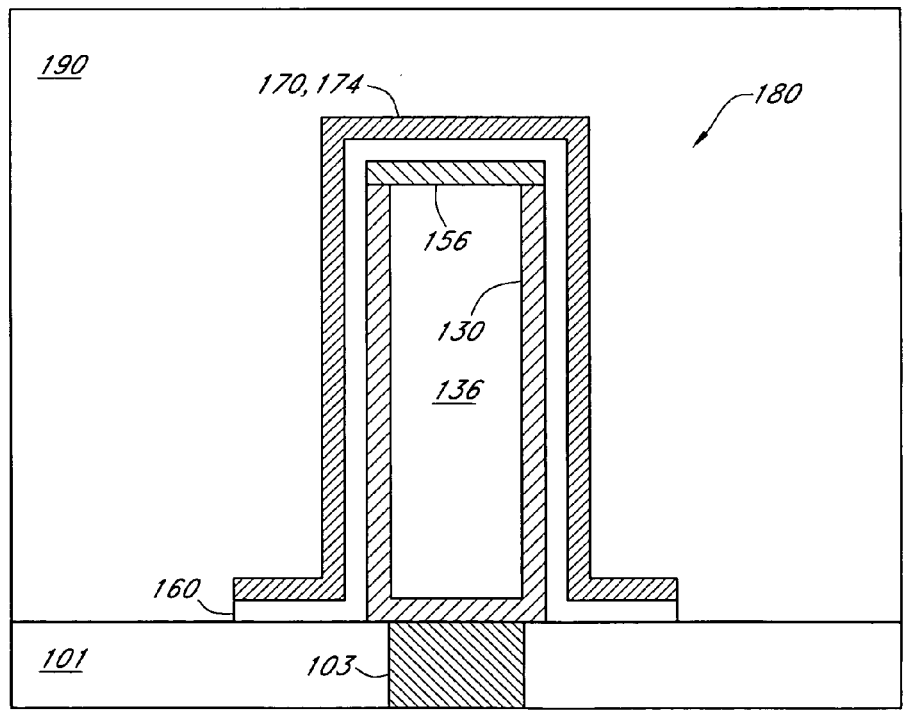
Figure 2B:
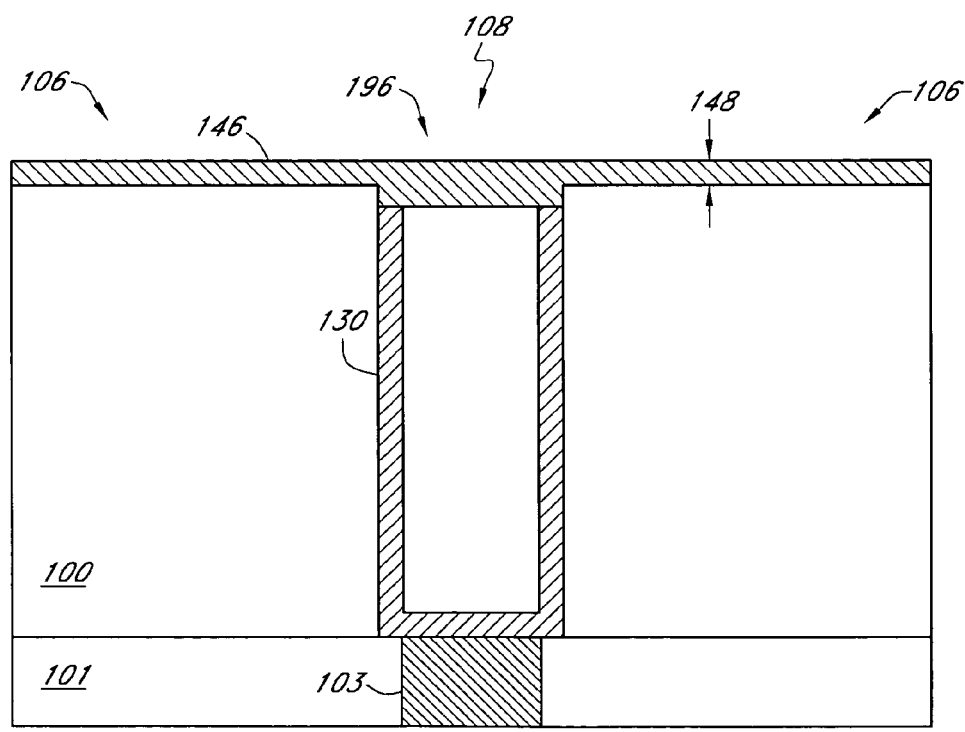
Figure 2C:
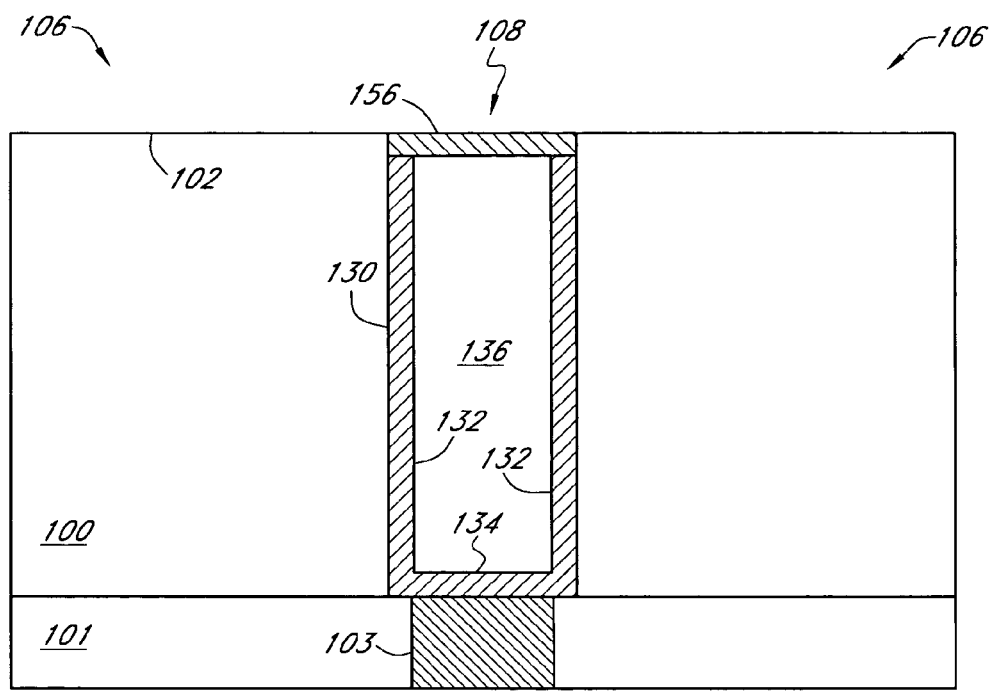

Subsequently, as illustrated in FIG. 2B, the electrode cap 156 may be formed with a blanket deposition of the second conductive layer 146 on the upper surface 102 of the first ILD layer 100 and within the recessed region 196 etched above the lower electrode 130. In addition, as illustrated in FIG. 2C, the blanket deposition of the second conductive layer 146 may then be subsequently followed by a planarization, using for example a CMP process, of the second conductive layer 146 to the upper surface 102 of the first ILD layer 100 so as to define the electrode cap 156. The process may continue with the subsequent processing steps of FIGS. 1H-1L without departing from the scope of the present invention. Advantageously, this alternative processing may reduce overfill and prevent cell to cell short, which may improve performance of the resultant capacitor structure.

FIG. 1H illustrates the removal of at least a portion of the first ILD layer 100 from adjacent to the lower electrode 130. Even though FIG. 1H illustrates complete removal of the first ILD layer 100, it should be appreciated that at least a portion of the first ILD layer 100 may remain intact depending on the particular application. FIG. 1H further illustrates a resultant free-standing structure of the lower electrode 130 after removal of at least a portion of the first ILD layer 100. In one aspect, as illustrated in FIG. 1H, the lower electrode 130 is thick enough to stand erect after removal or etch back of the first ILD layer 100. Moreover, the periphery field region 106 of the first ILD layer 100 may be etched down to the second ILD layer 101. In one embodiment, the periphery field region 106 of the first ILD layer 100 may be removed using a generally known pattern and etch technique. For example, a photo-mask is patterned so as to overlie the lower electrode 130. Next, the exposed material of the periphery field region 1063 is etched using a generally known etching technique, such as a dry or wet etch, and the photo-mask is subsequently removed from lower electrode 130. It should be appreciated that the removal or etching of the first ILD layer 100 may vary in magnitude depending on the particular application or desirable results of the skilled artisan without departing from the scope of the present invention.

FIG. 1I illustrates the conformal deposition of a dielectric layer 160 on the second ILD layer 101 and the lower electrode 130 including the sidewalls 132 and the electrode cap 156 thereof. In one embodiment, the dielectric layer 160 may comprise a layers of insulative material, such as Aluminum Oxide ($AlO_x$) or Hafnium Oxide having a thickness 162, for example, of approximately 40 Angstroms. Various fabrication techniques may be utilized for forming the dielectric layer 160 including, for example, deposition of an aluminum layer in a manner well known in the art followed by oxidizing the deposited aluminum layer by one of several different methods: plasma oxidation, oxidation by air, and ion-beam oxidation, wherein all are derived in a manner well known in the art. Additionally, as further illustrated in FIG. 1I, the dielectric layer 160 may be deposited in a manner so as to overlie the contour of the lower electrode 130 including overlying the exterior of the sidewalls 132 and the electrode cap 156.

It should be appreciated that, if the first ILD layer was not fully etched back to the second ILD layer 101, the dielectric layer 160 may also be deposited on at least a portion of the first ILD layer 100 without departing from the scope of the present invention. It should be appreciated that various other insulative materials may be deposited without departing from the scope of the present invention. Furthermore, it should also be appreciated that the thickness 162 of the dielectric layer 160 may vary in magnitude, for example, between approximately 30 Angstroms and 100 Angstroms, depending on the particular implementation without departing from the scope of the present invention.

FIG. 1J illustrates the conformal deposition of a third conductive layer 170 on the dielectric layer 160. In addition, the third conductive layer 170 may be deposited in a manner so as to contour the shape lower electrode 130 and overlie the dielectric layer 160 that was deposited adjacent the sidewalls 132 of the lower electrode 130. In one embodiment, the third conductive layer 170 comprises a layer of conductive material, such as platinum or various other noble metals including iridium and rhodium, having a thickness 172, for example, of approximately 200 Angstroms. Also, the third conductive layer 170 may be formed using, for example, a generally known furnace deposition process, such as CVD, PECVD, or the like. It should be appreciated that various other conductive materials or at least a portion thereof, such as polysilicon, TiNi, WSi, various other metals or metal alloys including copper, aluminum, silver, gold, etc., may be deposited without departing from the scope of the present invention. Moreover, it should also be appreciated that the thickness 172 of the second conductive layer 172 may vary in magnitude, for example, between approximately 30 Angstroms and 500 Angstroms, depending on the particular implementation without departing from the scope of the present invention.

In one embodiment, the third conductive layer 170 defines an upper electrode or top cell plate 174. In addition, the layering of the lower electrode 130, the dielectric layer 160, and the top cell plate 174 define a capacitor structure 180. The capacitor structure 180 may be used in memory devices, such as DRAM, or various other circuit devices, such as discrete capacitors and antifuses. As illustrated in FIG. 1J, the capacitor structure 180 is in electrical contact with the plug 103.

In one embodiment, the capacitor structure 180, as illustrated, defines a metal-insulator-metal (MIM) device that may be used as a MIM capacitor in integrated circuitry. It should be appreciated that the one or more of the device layers may be replaced with various other types of materials so as to form different types of capacitor devices for use in integrated circuitry. For example, the lower electrode 130 comprising, for example, platinum or some other noble metal may be replaced with a semiconductor material to thereby define a metal-insulator-semiconductor (MIS) device that may be used as a MIS capacitor. In another example, the metal and/or the semiconductor layers may be replaced with TiN (Titanium-Nitride) and/or WSi (Tungsten-Silicon) so as to form another type of capacitor device.

FIG. 1K illustrates the conformal deposition of an insulation layer or third ILD layer 190 on the third conductive layer 170. In one embodiment, the insulation layer 190 may be deposited in a manner so as to contour the shape of the capacitor structure 180 and overlie the top electrode plate 174. In addition, the insulation layer 190 may comprise a similar material as the first and second ILD layers 100, 101, such as BPSG or the various other types of substrate materials as previously described. Moreover, as illustrated in FIG. 1L, it should be appreciated that, prior to depositing the insulation layer 190 on the third conductive layer 170, the dielectric layer 160 and the third conductive layer 170 may have been patterned and etched in a generally known manner so as to isolate the capacitor structure 180 from neighboring components. Advantageously, the insulation layer 190 insulates the capacitor structure 180 from other components either embedded or otherwise located adjacent thereto and provides a means for access to the capacitor structure 180. Also, generally known vias (not shown) may be formed in the insulation layer 190 to the depth of the upper electrode or top cell plate 174 to thereby provide access to the capacitor structure 180.

One advantage of fabricating a capacitor structure 180 in a manner as previously described herein, with reference to FIGS. 1A-1L, is that the capacitor structure 180 comprises an increased surface area to thereby increase overall capacitance. This advantage may be realized with an improved performance of the capacitor structure 180. In general, the larger the surface area of a capacitor structure, the larger the capacitance as capacitance may be generally defined by $C=\epsilon A/d$, where '$\epsilon$' is defined as the dielectric constant of the material between the electrode plates, 'A' is defined as the area of the electrode plates, and 'd' is defined as the thickness of the material between the electrode plates.

Another advantage of fabricating the capacitor structure 180 in the previously described manner is that the interior plug 136 used to fill the cell container 108 of the lower electrode 130 comprises a lower cost conductive material, such as Nickel (Ni) or Cobalt (Co), which can be cheaper than using a more expensive conductive material, such as Platinum (Pt), to fill the cell container 108. In one aspect, the advantage of using a noble metal, for example, such as Platinum for the walls 132, 134 of the lower electrode 130 is that noble metals generally provide a more stable capacitor structure 180 with greater reliability and more predictable performance characteristics. Also, noble metals, for example, are generally less susceptible to oxidation between interfaces, such as the interface between the lower electrode 130 and dielectric layer 160. Furthermore, by filling the cell container 108 with a lower cost metal for the interior plug 136, the capacitor structure 180 comprises the advantages of a reduced fabrication cost of the interior plug 136 with the increased reliability of a stable lower electrode 130. It should be appreciated that other types of noble metals, such as Iridium (Ir) may be used to form the lower electrode 130, which may provide similar advantages as Platinum including increased reliability and performance.

Figure 3A:
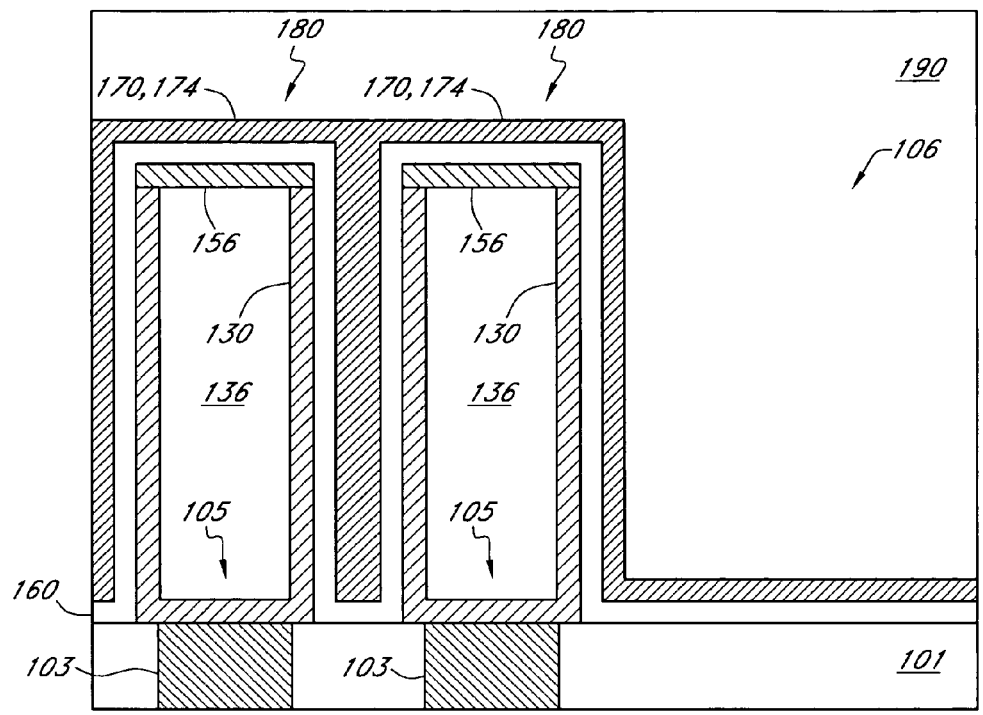
FIGS. 3A-3B illustrate one embodiment of a plurality capacitor structures formed using the method of FIGS. 1A-1L.
Figure 3B:
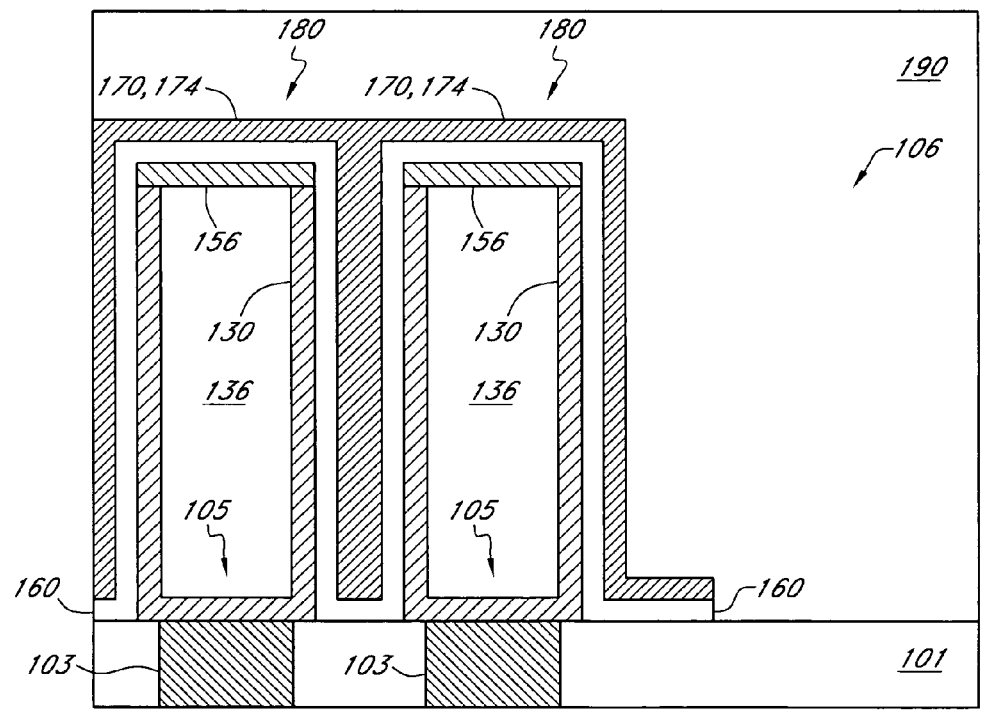

FIGS. 3A-3B illustrate one embodiment of a plurality of capacitor structures 180 formed on the second ILD layer 101 in a similar manner as previously described in relation to FIGS. 1A-1L. It should be appreciated that similar processing, fabrication, and forming techniques as previously described herein with respect to the single capacitor structure 180 of FIGS. 1A-1L may used to form the following plurality of capacitor structures 180 of FIGS. 3A-3B without departing from the scope of the present invention.

As illustrated in FIGS. 3A-3B, the lower electrodes 130 of the capacitor structures 180 may be adjacently formed so as to define a common region 200 interposed therebetween. In one aspect, the common region 200 may comprise a width 202 of approximately 1,000 Angstroms, but may vary in magnitude depending on the desired spacing of the lower electrodes 130 without departing from the scope of the present invention.

In addition, the second ILD layer 101 may comprise a plurality of generally known conductive plugs, traces, or contacts 103 that define a plurality of capacitor node regions 105. As illustrated in FIG. 3A, the plurality of capacitor structures 180 may be formed adjacent the capacitor node regions 105 and above the conductive plugs 103 so as to be in electrical contact therewith. Moreover, as illustrated in FIGS. 3A-3B, the dielectric layer 160 may be conformally deposited on the second ILD layer 101 and in the common region 200 so as to overlie the contour the shape of the lower electrodes 130 including the sidewalls 130 and the electrodes caps 156 thereof. Also, the third conductive layer 170 may be conformally deposited on the dielectric layer 160 and in the common region 200 so as to contour the shape thereof and form the upper electrode or top electrode plate 174 of the capacitor structures 180. In one embodiment, the upper electrode 174 may be common to the plurality of capacitor structures 180. As illustrated in FIG. 3B, the dielectric layer 160 and the upper electrode 174 may be patterned and etched in a generally known manner so as to isolate the capacitor structures 180 from neighboring components. FIGS. 3A-3B further illustrate the conformal deposition of the insulation layer or third ILD layer 190 on the upper electrode 174. In one embodiment, the insulation layer 190 may be deposited in a manner so as to contour the shape of the capacitor structures 180 and overlie the top electrode plate 174.

Advantageously, the processing techniques of FIGS. 1A-1L may be used to form the plurality of capacitor structures 180 of FIGS. 3A-3B. Therefore, the methods presented in relation to the present teachings can be used to form one or more of capacitor structures 180 so as to reduce manufacturing costs and increase fabrication efficiency.

Figure 4:
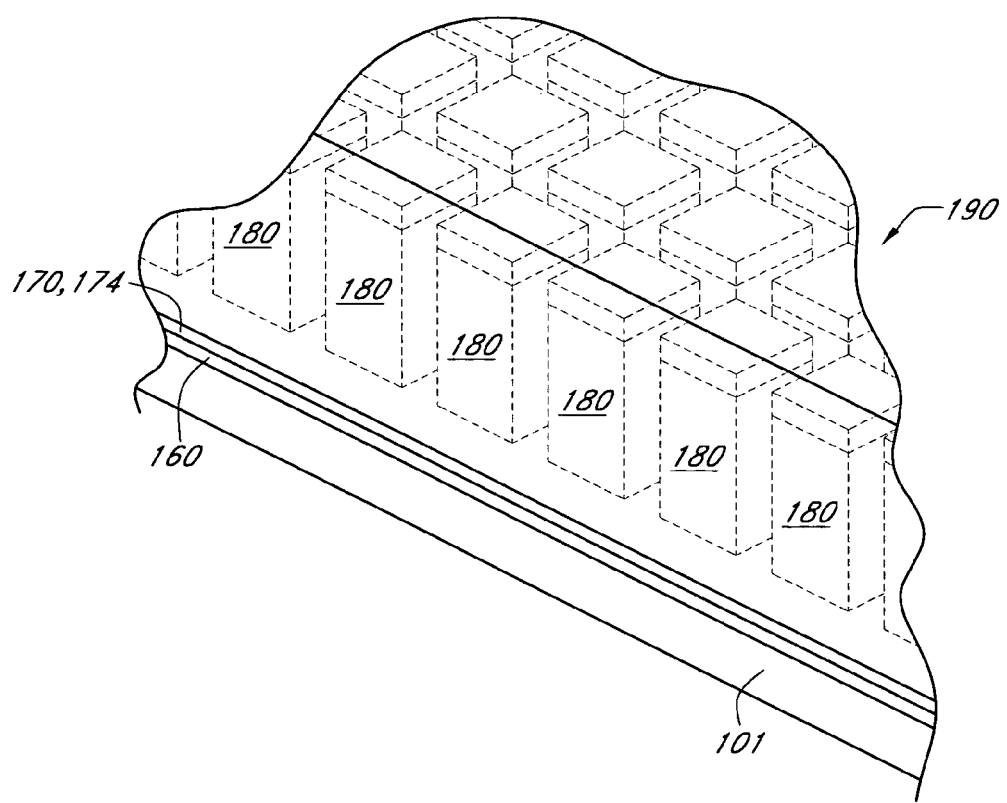
FIG. 4 illustrates one embodiment of an array of capacitor structures formed using the methods of FIGS. 1A-1L and FIGS. 3A-3B.

FIG. 4 illustrates one embodiment of an array of capacitor structures 180 formed on the second ILD layer 101 in a similar manner as previously described in relation to FIGS. 1A-1L and FIGS. 3A-3B. It should be appreciated that similar processing, fabrication, and forming techniques as previously described herein with respect to the single capacitor structure 180 of FIGS. 1A-1L and the plurality of capacitor structures 180 of FIGS. 3A-3B may used to form the following array of capacitor structures 180 of FIG. 4 without departing from the scope of the present invention.

In one aspect, the second ILD layer 101 may comprise a plurality of generally known conductive plugs, traces, or contacts (not shown) that are separately formed and abut the capacitor structures 180. Similar to the previous discussions, it should be appreciated that plugs, traces, or contacts (not shown) may be formed to define capacitor node regions (not shown) and may further comprise generally known electrical interconnects between the capacitor structures 180 and various circuit components (not shown), such as transistors or various other types of circuit components known in the art. Also, in a manner as previously described, the capacitor structures 180 may be formed adjacent the capacitor node regions and above the conductive plugs so as to be in electrical contact therewith.

Advantageously, the processing techniques of FIGS. 1A-1L and FIGS. 3A-3B may be used to form the array of capacitor structures 180 of FIG. 4. Therefore, the methods presented in relation to the present teachings can be used to form an array of capacitor structures 180 so as to reduce manufacturing costs and increase fabrication efficiency.

Although the foregoing description has shown, described and pointed out the fundamental novel features of the invention, it will be understood that various omissions, substitutions, and changes in the form of the detail of the apparatus as illustrated, as well as the uses thereof, may be made by those skilled in the art, without departing from the spirit or scope of the present invention. Consequently, the scope of the invention should not be limited to the foregoing discussion, but should be defined by the appended claims.

What is claimed is:

1. An array of capacitor structures for a semiconductor device, the array comprising:
   a substrate;
   a plurality of electrode studs that extend outward from the substrate, wherein each electrode stud comprises an outer container having opposing sidewalls and a base wall formed of a first material and an inner plug formed of a second material, which is different from the first material, wherein the opposing sidewalls and the base wall are joined together to form a lower electrode and to define an interior recess adapted for receiving the inner plug, wherein each electrode stud further comprises an electrode cap layer positioned on the outer container so as to completely enclose the inner plug, wherein the electrode cap layer lies over the opposing sidewalls of the outer container in a manner such that the electrode cap layer is in direct contact with the inner plug and extends over an upper surface of the opposing sidewalls so as to overlie the outer container, wherein a width of the electrode cap layer approximates a width of the lower electrode such that the electrode cap layer is coextensive with the lower electrode and does not extend beyond the opposing sidewalls;
   a dielectric layer positioned over at least a portion of the plurality of electrode studs, and wherein a bottom surface of the dielectric layer is coplanar with a bottom surface of the base wall of the each electrode stud; and
   a top electrode positioned over at least a portion of the dielectric layer, wherein the top electrode is common to the array of capacitor structures.

2. The array of claim 1, wherein the plurality of electrode studs include at least three electrode studs.

3. The array of claim 1, wherein the plurality of electrode studs are spaced a first distance apart.

4. The array of claim 1, wherein each electrode cap layer comprises a material selected from the group consisting of Platinum, Iridium, and Osmium.

5. The array of claim 1, wherein each inner plug comprises a material selected from the group consisting of Nickel and Cobalt.

6. The array of claim 1, wherein the dielectric layer comprises a material selected from the group consisting of Aluminum Oxide and Hafnium Oxide.

7. The array of claim 1, wherein the top electrode comprises a material selected from the group consisting of Platinum and Iridium.

\* \* \* \* \*